United States Patent
Kondo

(10) Patent No.: US 11,474,157 B2
(45) Date of Patent: Oct. 18, 2022

(54) METHOD FOR EVALUATING SECONDARY BATTERY, DEVICE FOR EVALUATING SECONDARY BATTERY, AND POWER SUPPLY SYSTEM

(71) Applicant: TOYOTA JIDOSHA KABUSHIKI KAISHA, Toyota (JP)

(72) Inventor: Minako Kondo, Toyota (JP)

(73) Assignee: TOYOTA JIDOSHA KABUSHIKI KAISHA, Toyoto (JP)

( * ) Notice: Subject to any disclaimer, the term of this patent is extended or adjusted under 35 U.S.C. 154(b) by 360 days.

(21) Appl. No.: 16/749,392

(22) Filed: Jan. 22, 2020

(65) Prior Publication Data
US 2020/0241075 A1 Jul. 30, 2020

(30) Foreign Application Priority Data
Jan. 28, 2019 (JP) .............................. JP2019-012508

(51) Int. Cl.
| H01M 10/42 | (2006.01) |
| G01R 31/388 | (2019.01) |
| G01R 31/389 | (2019.01) |
| H01M 10/48 | (2006.01) |

(52) U.S. Cl.
CPC ......... G01R 31/388 (2019.01); G01R 31/389 (2019.01); H01M 10/4285 (2013.01); H01M 10/48 (2013.01)

(58) Field of Classification Search
CPC .. G01R 31/388; G01R 31/389; G01R 31/392; H01M 10/425; H01M 10/4285; H01M 10/44; H01M 10/48; H01M 10/486; Y02E 60/10
See application file for complete search history.

(56) References Cited

U.S. PATENT DOCUMENTS

| 2011/0112782 A1 | 5/2011 | Majima et al. |
| 2018/0090962 A1 | 3/2018 | Cha et al. |

FOREIGN PATENT DOCUMENTS

| CN | 102084262 A | 6/2011 |
| CN | 107534188 A | 1/2018 |
| JP | 2009-44902 A | 2/2009 |
| JP | 2010-212013 A | 9/2010 |
| JP | 2011-232345 A | 11/2011 |

*Primary Examiner* — Victoria H Lynch
(74) *Attorney, Agent, or Firm* — Sughrue Mion, PLLC

(57) ABSTRACT

A device for evaluating a secondary battery disclosed herein includes: a first acquirer that acquires information on a predetermined item from a secondary battery to be evaluated; an output current determiner that determines an output current value to be output from the secondary battery based on the information obtained by the first acquirer; and an evaluator that evaluates a deterioration state of the secondary battery based on discharge data obtained when the output current value determined by the output current determiner is output.

12 Claims, 7 Drawing Sheets

|  |  | TEMPERATURE | | | | | | | |
|---|---|---|---|---|---|---|---|---|---|
|  |  | −30°C | −20°C | −10°C | 0°C | 10°C | ... | 50°C | 60°C |
| BATTERY CAPACITY | 100% | ... | ... | ... | ... | ... | ... | ... | ... |
|  | 90% | ... | ... | ... | ... | ... | ... | ... | ... |
|  | 80% | ... | ... | ... | ... | ... | ... | ... | ... |
|  | ... | ... | ... | ... | ... | ... | ... | ... | ... |
|  | 60% | ... | ... | ... | ... | ... | ... | ... | ... |
|  | 50% | ... | ... | ... | ... | ... | ... | ... | ... |
|  | ... | ... | ... | ... | ... | ... | ... | ... | ... |

METHOD FOR EVALUATING SECONDARY BATTERY, DEVICE FOR EVALUATING SECONDARY BATTERY, AND POWER SUPPLY SYSTEM

CROSS REFERENCE TO RELATED APPLICATIONS

The present application claims priority from Japanese Patent Application No. 2019-012508 filed on Jan. 28, 2019, which is incorporated by reference herein in its entirety.

BACKGROUND

The disclosure herein relates to a method for evaluating a secondary battery, a device for evaluating a secondary battery, and a power supply system.

JP 2011-232345 A discloses a method for determining deterioration of a secondary battery. This publication discloses a comparison between a voltage drop at discharge in a predetermined time with a predetermined constant discharge current or a discharge current pulse, and a voltage drop of a non-defective product. This publication mentions that "deterioration can be determined using a predetermined threshold by detecting a voltage drop with respect to a discharge duration based on a discharge current value and a temperature, and the discharge duration is determined beforehand based on the discharge current value and the temperature, and a voltage drop in the case of discharge in this condition is used for deterioration determination."

JP 2010-212013 A discloses a power supply system that sequentially acquires a relationship between an elapsed time from discharge start and a battery voltage, and based on the relationship between the elapsed time and the battery voltage, the value of a discharge current of a lithium ion secondary battery is controlled.

SUMMARY

An inventor found that the even deterioration determination of a secondary battery as described above might erroneously determine deterioration of the secondary battery. In view of this, the inventor intended to increase accuracy in determining deterioration of a secondary battery.

Embodiments of a method for estimating a battery capacity disclosed herein includes a first step, a second step, and a third step. Here, the first step is the step of obtaining information on a predetermined item from a secondary battery to be evaluated. The second step is the step of determining an output current value A1 to be output from the secondary battery to be evaluated, based on the information obtained in the first step. The third step is the step of evaluating a deterioration state of the secondary battery to be evaluated, based on discharge data obtained when the output current value A1 determined in the second step is output.

Here, the information obtained in the first step may be at least one measured value selected from the group consisting of a battery capacity, a battery temperature, a battery resistance, and a voltage value.

The second step may be the step of determining the output current value A1 to be output from the secondary battery based on a control map in which a relationship between the information obtained in the first step and the output current value A1 is stored beforehand.

The discharge data may include a voltage V1 at discharge start and a voltage V2 after a lapse of a predetermined time from the discharge start, and in the third step, it may be determined whether $(V1-V2)/A1$ is higher than a predetermined threshold R0 or not, based on the voltage V1, the voltage V2, and the output current value A1.

Embodiments of a device for evaluating a secondary battery disclosed herein includes a first acquirer, an output current determiner, and an evaluator. The first acquirer may be configured to acquire information on a predetermined item from a secondary battery to be evaluated. The output current determiner may be configured to determine an output current value A1 to be output from the secondary battery, based on the information obtained by the first acquirer. The evaluator may be configured to evaluate a deterioration state of the secondary battery, based on discharge data obtained when the output current value A1 determined by the output current determiner is output. The current value can be acquired from an ammeter that detects a current flowing in the secondary battery.

The information obtained by the first acquirer may be at least one measured value selected from the group consisting of, for example, a battery capacity, a battery temperature, a battery resistance, and a voltage value.

The evaluation device may further includes a memory in which a relationship between the information obtained by the first acquirer and the output current value A1 to be output from the secondary battery is stored beforehand.

The output current determiner may be configured to determine the output current value A1 based on the relationship between the information obtained by the first acquirer and the relationship stored in the memory.

The discharge data may include a voltage at discharge start and a voltage after a lapse of a predetermined time from the discharge start, and the evaluator may be configured to determine whether $(V1-V2)/A1$ is higher than a predetermined threshold R0 or not, based on the voltage V1, the voltage V2, and the output current value A1.

Embodiments of a power supply system disclosed herein includes a secondary battery and a controller that controls an output of electric power to the secondary battery. The controller may include a structure as the device for estimating a battery capacity described above.

DETAILED DESCRIPTION

Hereinbelow, embodiments of a device for evaluating a secondary battery and a method for evaluating (i.e., a method for determining deterioration of) a secondary battery according to the present disclosure will be described in detail. It should be noted, however, that the embodiments described herein are, of course, not intended to limit the present invention. The present invention is not limited to the embodiments described herein unless specifically stated otherwise.

Figure 1:
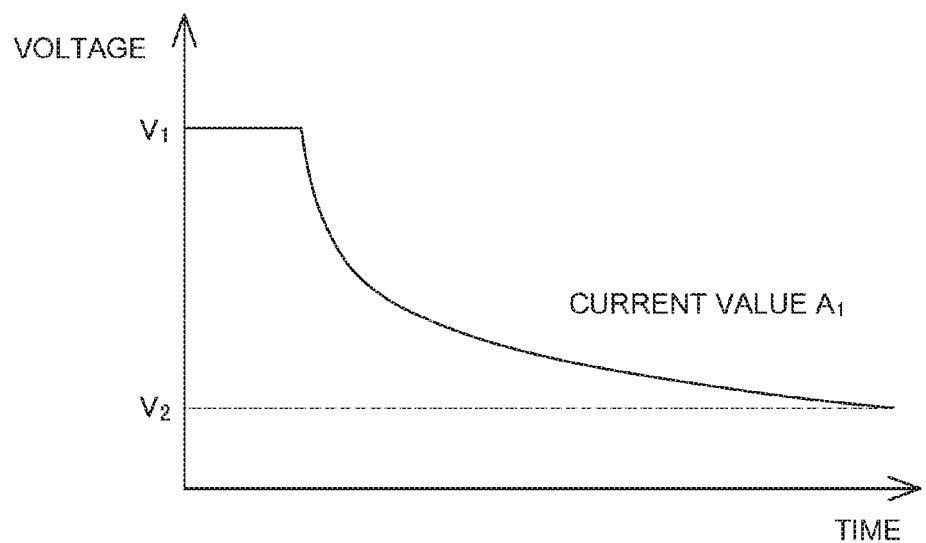
FIG. 1 is a graph showing an example of a discharge curve obtained by a deterioration determination process.

FIG. 1 is a graph showing an example of a discharge curve obtained by a deterioration determination process. The deterioration of a secondary battery determined herein is a resistance increase rate of a secondary battery. Deterioration of a secondary battery mounted on a vehicle can be determined based on whether a "resistance value satisfying a required output from the vehicle" is satisfied or not.

As illustrated in FIG. 1, for example, in a deterioration determination process, a discharge curve is acquired at a predetermined current value A1. At this time, a voltage drop amount (V1−V2) is acquired from a difference between a voltage V1 at discharge start and a voltage V2 after a lapse of a predetermined time. As an output current value A1 (also referred to as a discharge current value) increases, a voltage drop amount per a unit time increases. In addition, as the battery temperature decreases, the voltage drop amount increases. The voltage drop amount tends to increase as the resistance of a secondary battery deteriorates (i.e., as the resistance of the secondary battery deteriorates so that the resistance increases).

In view of this, the output current value A1 is defined beforehand. In addition, by using the output current value A1 and a battery temperature at discharge start, the secondary battery is adjusted to a predetermined open-circuit voltage, and a voltage drop amount serving as a reference at discharge in a predetermined time is defined. The secondary battery adjusted to the predetermined open-circuit voltage is discharged in a predetermined time with the output current value A1. If the voltage drop amount is larger than the voltage drop amount serving as the predetermined reference, the secondary battery is determined to be deteriorated.

Further, (V1−V2)/A1 is obtained by dividing the voltage drop amount (V1−V2) by a current value A1 in obtaining a discharge curve. If (V1−V2)/A1 is larger than a predetermined resistance value, the secondary battery may be determined to have "deteriorated." Herein, in deterioration determination of a secondary battery mounted on an electric motor vehicle as a driving power supply, the "predetermined resistance value" can be defined as a resistance value satisfying a required output from the vehicle. That is, deterioration of the secondary battery can be determined based on whether (V1−V2)/A1>"resistance value satisfying required output from vehicle" is satisfied or not.

As described above, various methods have been proposed to determine deterioration of a secondary battery based on the voltage drop amount (V1−V2) obtained by discharging a secondary battery with a constant output current value A1. In such a deterioration determination method, if the voltage drop amount (V1−V2) is small in measurement, for example, it is determined that "the secondary battery does not deteriorate."

An evaluation device implementing such a method for evaluating a secondary battery can be obtained in an ECU as a controller 100 for controlling an output and an input of the secondary battery 20 mounted on a vehicle, for example.

Figure 2:
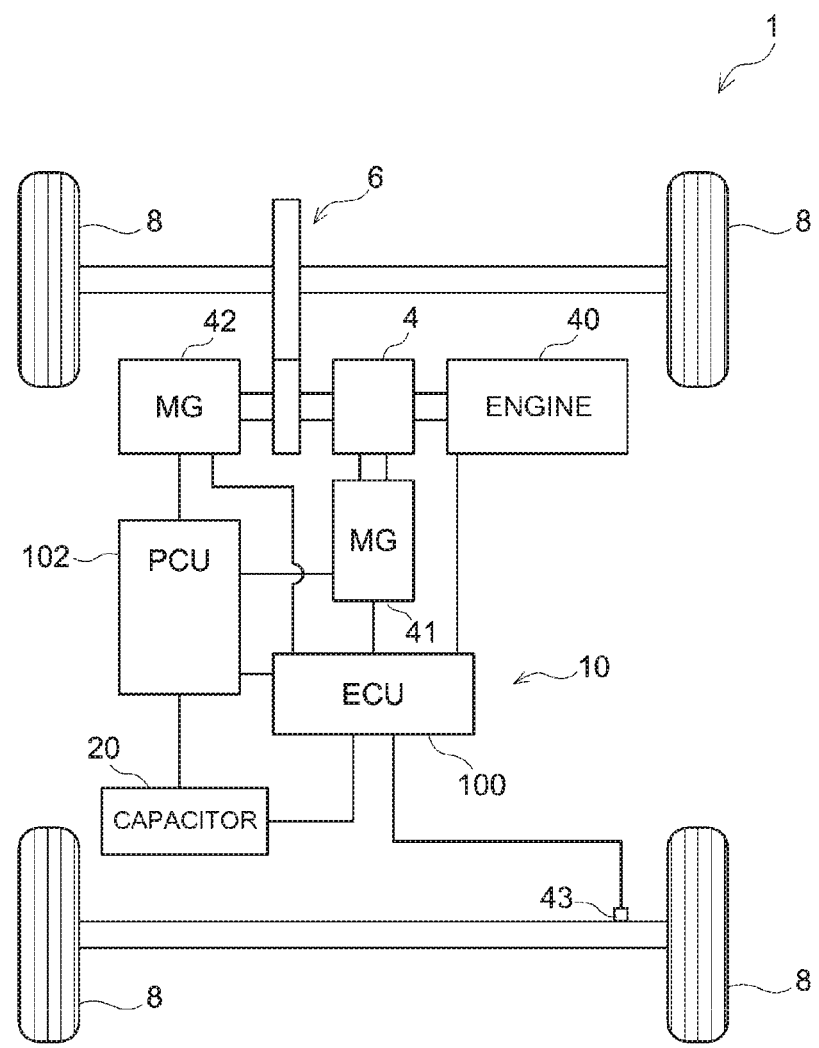
FIG. 2 schematically illustrates a vehicle 1 incorporating a device for estimating a battery capacity.

FIG. 2 schematically illustrates a vehicle 1 incorporating a device for estimating a battery capacity. As illustrated in FIG. 2, the vehicle 1 is a hybrid vehicle including an engine 40 and motor generators (MGs) 41 and 42. The vehicle 1 includes a power divider 4, a speed reducer 6, wheels 8, a power control unit (PCU) 102, a capacitor as the secondary battery 20, an electronic control unit (ECU) as the controller 100, the engine 40, the motor generators 41 and 42, and a vehicle speed sensor 43.

The inventor of the present teaching found that when the capacity of the secondary battery 20 deteriorates, an SOC-OCV curve changes. As the capacity deterioration progresses, resistance of the secondary battery 20 increases, and the secondary battery 20 easily generates heat when electrified. The "SOC" herein stands for a state of charge. The SOC is represented by, for example, a charging rate with a full-charge state set of 100%. The "OCV" stands for an open circuit voltage, and means an open-circuit voltage.

Figure 3:
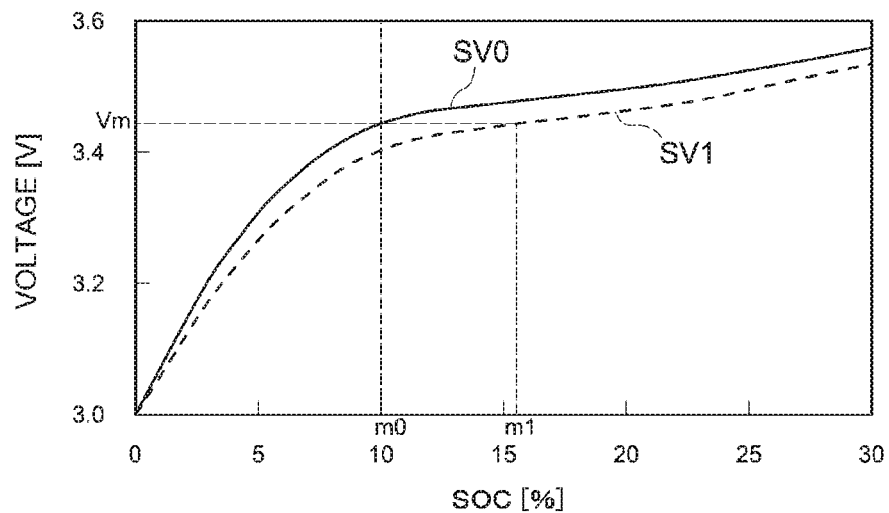
FIG. 3 is a graph showing an example of an SOC-OCV curve of a secondary battery.

FIG. 3 is a graph showing an example of an SOC-OCV curve of a secondary battery. A solid-line graph SV0 in FIG. 3 is an SOC-OCV curve of a non-defective secondary battery 20 (see FIG. 2). A broken-line graph SV1 is an SOC-OCV curve of a secondary battery 20 whose capacity has deteriorated.

In a case where the degree of capacity deterioration of the secondary battery 20 as a target of deterioration determination is not known, as shown in FIG. 3, for example, an SOC of the battery is determined based on an open-circuit voltage with reference to an SOC-OCV curve SV0 of the non-defective secondary battery. In this case, the SOC of the deteriorated secondary battery 20 is determined to be lower than an actual SOC. In other words, in the secondary battery 20 whose capacity has deteriorated, an actual SOC is higher than an SOC determined based on the open-circuit voltage with reference to the SOC-OCV curve SV0 of the non-defective secondary battery in some cases. With the same SOC, an open-circuit voltage of the deteriorated secondary battery 20 is lower than that of the non-defective secondary battery 20 in some cases.

For example, if an open-circuit voltage Vm corresponding to an SOC of 10% in the SOC-OCV curve SV0 of the non-defective secondary battery 20 is applied to the SOC-OCV curve SV1 of the deteriorated secondary battery 20, a higher SOC (about an SOC of about 17% in the example shown in FIG. 3) is shown. That is, with the same open-circuit voltage, on the SOC-OCV curve, the SOC of the deteriorated secondary battery 20 is higher than the SOC of the non-defective secondary battery 20 in some cases.

On the SOC-OCV curve SV0 of the non-defective secondary battery, the OCV changes more significantly with respect to the SOC at about an SOC of about 10% than at an SOC of about 30%. On the other hand, in the open-circuit voltage corresponding to an SOC of 10% of the non-defective secondary battery 20, the deteriorated secondary battery 20 is in a high-SOC state. That is, even when the deteriorated secondary battery 20 is adjusted to the same open-circuit voltage equal to an SOC of 10% of the non-defective secondary battery, the SOC of the deteriorated secondary battery 20 is higher than 10%, and a voltage changes gently with respect to the SOC. Thus, in a case where the secondary battery is adjusted to the same open-circuit voltage and discharge is started with the same discharge current value, the voltage drop amount of the non-defective secondary battery 20 with an SOC of 10% can be substantially equal to the voltage drop amount of the deteriorated secondary battery 20 in some cases.

In deterioration determination, in a case where a discharge curve is obtained by discharging with a constant current value, the discharge curve can be obtained by discharging the battery to a region where the voltage drop amount is large at an SOC of about 10% or less in some cases. In such cases, the secondary battery is adjusted to a predetermined voltage as an open-circuit voltage, and is discharged with the same constant current so that a discharge curve is obtained. At this time, as shown in FIG. 3, the SOC of the deteriorated secondary battery 20 is higher than the SOC of the non-defective secondary battery in some cases.

Thus, in a case where a discharge curve is obtained by discharging the battery with a constant current value from this state, the voltage drop amount of the deteriorated secondary battery 20 is not larger than that of the non-defective secondary battery in some cases. That is, as shown in FIG. 3, in a case where the secondary battery is adjusted to an SOC of 10% based on the open-circuit voltage, the SOC of the deteriorated secondary battery 20 is adjusted to be as high as 17%, for example. In such cases, if a current value in obtaining a discharge curve is small and the discharge duration is short, the voltage drop amount of the deteriorated secondary battery 20 can be smaller than the voltage drop amount of the non-defective secondary battery. If a threshold is defined with reference to the voltage drop amount of the non-defective secondary battery 20 for deterioration determination, even a deteriorated secondary battery might be determined as "non-defective" and an erroneous determination can be made in deterioration determination.

Figure 4:
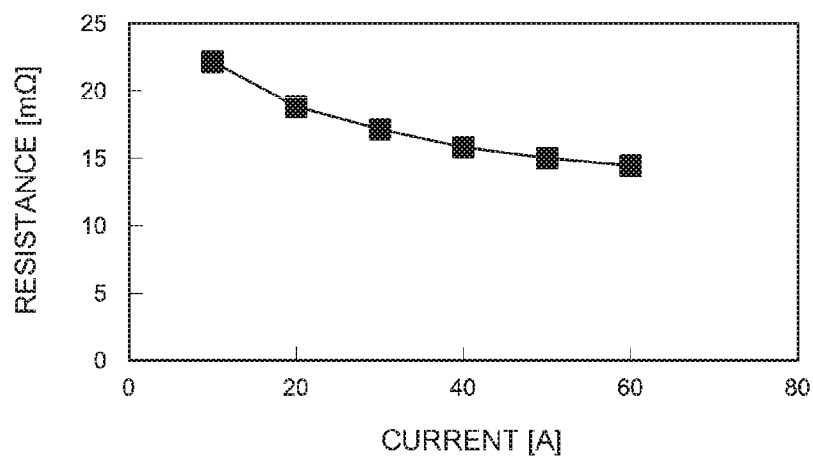
FIG. 4 is a graph showing tendencies of a current value and a resistance at a low temperature.
Figure 5:
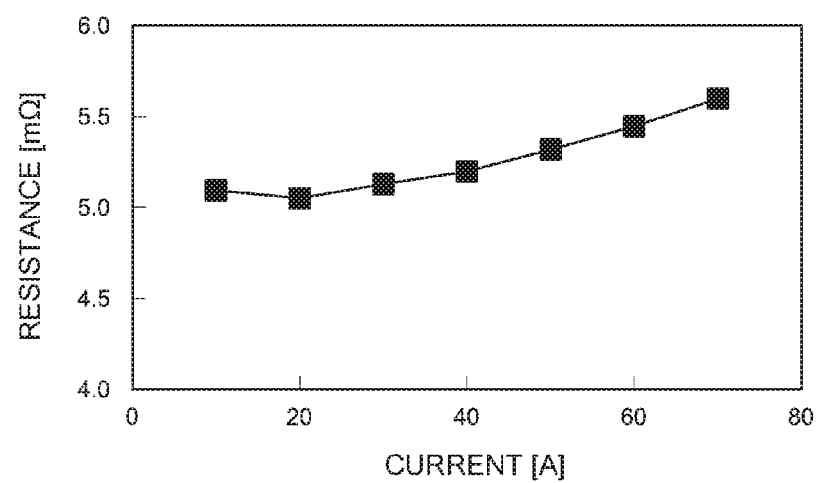
FIG. 5 is a graph showing tendencies of a current value and a resistance at room temperature (25° C. in this example).

FIG. 4 is a graph showing tendencies of a current value and a resistance at a low temperature. As shown in FIG. 4, at a low temperature such as −30° C., a measured resistance tends to decrease as a current value increases. This is because an internal resistance decreases under the influence of heat generated in the battery by electrification so that the measured resistance decreases. The deteriorated secondary battery easily generates heat inside the battery by electrification. Thus, at a low temperature such as −30° C., the internal resistance can be evaluated to be low. FIG. 5 is a graph showing tendencies of a current value and a resistance at room temperature (25° C. in this example). At room temperature, as the current value increases, a measured resistance tends to increase. As described above, the resistance of the secondary battery is affected by temperature. In the case of obtaining a discharge curve by discharging the battery with a constant current value independently of the temperature of the battery, the voltage drop amount of the deteriorated secondary battery might be evaluated to be small. Such a phenomenon can be a factor of the erroneous determination in deterioration determination.

Based on the foregoing findings, the inventor of the present teaching proposes a method and a device for evaluating a secondary battery.

The method for evaluating the secondary battery 20 disclosed herein includes a first step, a second step, and a third step. The first step is a step of obtaining information on a predetermined item from a secondary battery 20 to be evaluated. The second step is a step of determining an output current value A1 to be output from the secondary battery 20 to be evaluated, based on the information obtained in the first step. The third step is a step of evaluating a deterioration state of the secondary battery 20 to be evaluated, based on discharge data obtained when the output current value A1 determined in the second step is output.

The information obtained in the first step can be, for example, at least one measured value selected from the group consisting of a battery capacity, a battery temperature, a battery resistance, and a voltage value. The second step can be a step of determining the output current value A1 based on a control map in which a relationship between information obtained by a first acquirer and an output current value A1 to be output from the secondary battery 20 is stored beforehand. The third step can be a step of determining whether (V1−V2)/A1 obtained from a voltage V1 at discharge start and a voltage V2 after a lapse of a predetermined time from the discharge start in the discharge data is higher than a predetermined threshold R0 or not.

Figure 6:
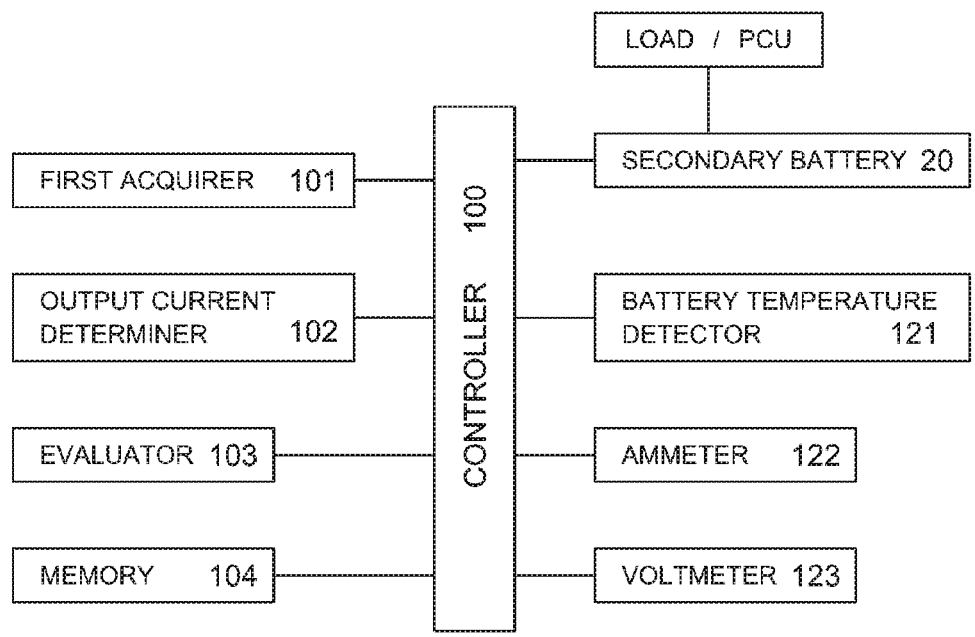
FIG. 6 is a block diagram of a power supply system 10.

FIG. 6 is a block diagram of a power supply system 10. As illustrated in FIG. 2, the power supply system 10 disclosed herein includes the secondary battery 20 and the controller 100 for controlling an output of electric power to the secondary battery. The secondary battery 20 can be a secondary battery for use as a power supply for driving an electric motor vehicle such as a hybrid vehicle or an electric vehicle (see FIG. 2). The controller 100 can be a controller for controlling an input and an output of the secondary battery as a power supply for driving the electric motor vehicle. An evaluation device implementing a method for evaluating a secondary battery is incorporated in the controller 100.

The controller 100 can be implemented by, for example, a computer that is driven according to a predetermined program. Specifically, functions of the controller 100 are processed by cooperation of a computation device (also referred to as a processor, a central processing unit (CPU), or a micro-processing unit (MPU)) of each computer constituting the controller 100, a hardware such as a storage device (e.g., a memory or a hard disk), and software. For example, an architecture and a process of the controller 100 can be implemented as, for example, a processing module or a part of the processing module that performs a predetermined computation in accordance with a database storing data to be implemented by the computer in a predetermined format, a data structure, and a predetermined program. As illustrated in FIG. 2, the functions of the controller 100 can incorporated in, for example, an ECU for controlling the secondary battery 20 in the case of a vehicle.

As illustrated in FIG. 6, the controller 100 includes a first acquirer 101, an output current determiner 102, an evaluator 103, and a memory 104. The controller 100 is configured to control the secondary battery 20 and obtain necessary information from a battery temperature detector 121, an ammeter 122, and a voltmeter 123.

The first acquirer 101 is configured to obtain information on a predetermined item from the secondary battery 20. The information acquired by the first acquirer can be, for example, at least one measured value selected from the group consisting of a battery capacity, a battery temperature, a battery resistance, and a voltage value.

The battery capacity can be, for example, a full charge capacity. The battery temperature can be acquired by the battery temperature detector 121. The battery temperature can be temperature data acquired based on a signal detected by a temperature sensor attached to a predetermined portion of the secondary battery 20. The battery resistance can be an IV resistance detected at an input and an output to/from the secondary battery 20. The voltage value can be a voltage in a state where no current flows in the secondary battery 20 (i.e., a so-called open-circuit voltage), and data acquired from the voltmeter 123 for detecting a voltage.

Figures 7, 8:
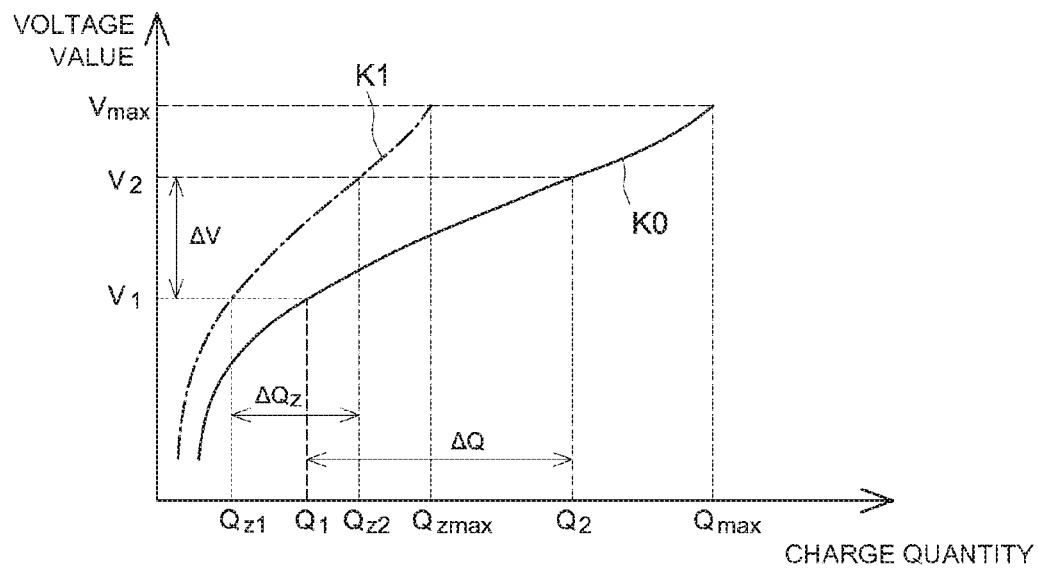
FIG. 7 is a graph showing an example of a change of a charge/discharge characteristic with deterioration of a secondary battery 20.
FIG. 8 is a matrix table showing an example of a control map.

An example of derivation of a battery capacity will now be described. FIG. 7 is a graph showing an example of a change of a charge/discharge characteristic with deterioration of the secondary battery 20. As indicated by a solid line in FIG. 7, the controller 100 stores data concerning a reference charge/discharge characteristic K0 experimentally measured beforehand. The reference charge/discharge characteristic K0 represents a relationship between a charge quantity and a voltage value in a normal condition (e.g., an initial state at shipment) of the secondary battery 20 to be subjected to deterioration determination. That is, the reference charge/discharge characteristic K0 is obtained by plotting a charge quantity stored in the secondary battery 20 in the normal condition and a corresponding voltage value. As shown in FIG. 7, such a reference charge/discharge characteristic K0 is generally a monotone function, and thus, the charge quantity and the voltage value correspond to each other uniquely. The voltage value herein refers to an open-circuit voltage, and is an output terminal voltage in a case where none of a load current and a charge current is generated in the secondary battery 20.

By previously acquired such a reference charge/discharge characteristic K0, it can be determined that the charge quantity in charging in a case where the voltage value of the secondary battery 20 increases from V1 to V2 is $\Delta Q$ ($=Q2-Q1$) that is a difference between the charge quantities Q1 and Q2 corresponding to the voltage values V1 and V2, respectively. In the reference charge/discharge characteristic, a charge quantity Qmax corresponding to a maximum voltage value Vmax corresponds to a "full charge capacity" in the normal condition.

When deterioration of the secondary battery 20 progresses, the reference charge/discharge characteristic K0 shown in FIG. 7 comes to have a shape that seems to be "reduced" on the abscissa. In FIG. 7, a dot-dash line represents an example of a current charge/discharge characteristic K1 of the secondary battery 20 whose deterioration progresses to a certain degree. In the current charge/discharge characteristic K1, with the progress of deterioration, the charge quantity in charging that is the maximum voltage value Vmax, that is, the full charge capacity, decreases to Qzmax.

Herein, since the current charge/discharge characteristic K1 can be assumed as the entire reference charge/discharge characteristic K0 reduced to the abscissa direction (the axis of charge quantity) at a predetermined proportion, a full charge capacity can be derived based on a proportion of a charge quantity necessary for generating the same voltage value change. Specifically, in the reference charge/discharge characteristic K0, the charge quantity necessary for changing the voltage value from V1 to V2 is $\Delta Q$. A charge quantity in charging in a case where the voltage value of the deteriorated secondary battery 20 increases from V1 to V2 is $\Delta Qz$ ($=Qz2-Qz1$) that is a difference between the charge quantities Qz1 and Qz2 corresponding to the voltage values V1 and V2, respectively.

On the other hand, in the current charge/discharge characteristic K1, if a charge quantity $\Delta Qz$ necessary for changing the voltage value from V1 to V2 similarly is obtained, based on the relationship of $\Delta Q : \Delta Qz = \Delta Qmax : \Delta Qzmax$, the full charge capacity can be derived as $Qzmax = \Delta Qmax \times \Delta Qz / \Delta Q$. The foregoing description has been directed to the case of deriving the full charge capacity based on a voltage value change in charging as an example. However, the full charge capacity can also be derived similarly, based on a voltage value change in discharging.

Thus, in a period from when a current (charge current or load current) starts flowing in the secondary battery 20 to when the current flow finishes, the controller 100 acquires an integrated value of the current that has flowed, a voltage value immediately before the current starts flowing, and a voltage value immediately after the current flow finishes. The thus-acquired values correspond to a charge quantity $\Delta Qz$, a voltage value V1 (V2), and a voltage value V2 (V1), respectively, in FIG. 7. Then, based on the acquired voltage values V1 and V2, the controller 100 obtains a charge quantity $\Delta Q$ necessary in the reference charge/discharge characteristic, and by using a full charge capacity Qmax in the reference charge/discharge characteristic as a reference, the controller 100 can derive a full charge capacity Qzmax at the current time. As described above, since the reference charge/discharge characteristic K0 is stored beforehand, the controller 100 can be configured to estimate a charge/discharge characteristic K1 at the current time, and derive the full charge capacity Qzmax at the current time.

The output current determiner 102 is configured to determine an output current value A1 to be output from the secondary battery 20 based on information obtained by the first acquirer 101. For example, the output current determiner 102 may be configured to determine a required current value based on the information obtained by the first acquirer 101 in the case of performing deterioration determination of the secondary battery 20. That is, in the method and the device for evaluating a secondary battery disclosed herein, in the case of performing deterioration determination of the secondary battery 20, an output current value A1 to be discharged from the secondary battery 20 is determined.

The output current value A1 determined by the output current determiner 102 can be defined to obtain a discharge curve appropriate for deterioration determination from the secondary battery 20, based on the information acquired by the first acquirer 101. In this embodiment, the controller 100 includes the memory 104.

The memory 104 may store a relationship between the information acquired by the first acquirer 101 and the output current value A1 to be output from the secondary battery 20. The relationship between the information acquired by the first acquirer 101 and the output current value A1 to be output from the secondary battery 20 may be prepared as a control map beforehand, for example. Specifically, if the information acquired by the first acquirer is a battery capacity and a battery temperature, the control map may be set such that the output current value A1 is specified based on the battery capacity and the battery temperature. FIG. 8 is a matrix table showing an example of the control map.

The control map shown in FIG. 8 is constituted by a matrix whose ordinate represents a battery capacity and abscissa represents a battery temperature, and a predetermined output current value A1 is recorded in the matrix. With the control map, an output current value A1 is specified based on the battery capacity and the battery temperature acquired by the first acquirer 101. The configuration of the control map is not limited to this example. The information acquired by the first acquirer can be, for example, at least one measured value selected from the group consisting of a battery capacity, a battery temperature, a battery resistance, and a voltage value. In this case, the control map may be set such that the output current value A1 is specified based on the information acquired by the first acquirer. For example, the control map is not limited to the example shown in FIG. 8, and may be configured such that a matrix in which conditions are subdivided based on the information acquired by the first acquirer, and each output current value A1 is specified.

Figure 9:
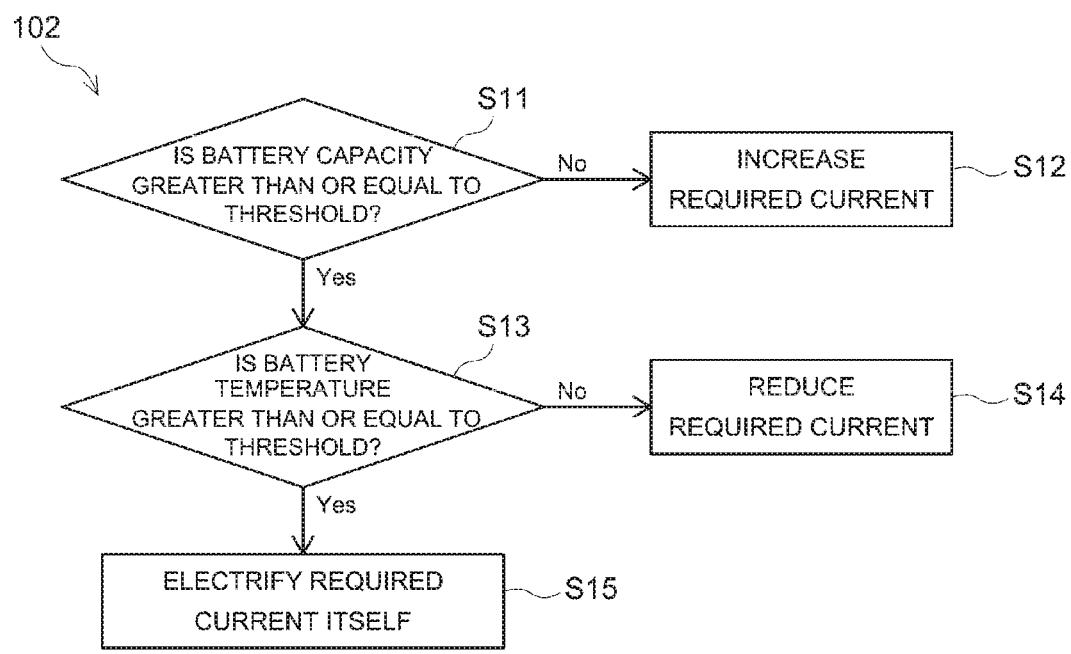
FIG. 9 is a flowchart depicting an example of a process flow of an output current determiner 102.

The output current determiner 102 may be configured such that a threshold is set with respect to the information obtained by the first acquirer 101, and in accordance with the information (data) obtained by the first acquirer 101, an output current value A1 to be output from the secondary battery 20 is determined with a predetermined processing flow. FIG. 9 is a flowchart depicting an example of a process flow of the output current determiner 102. As the information obtained by the first acquirer 101, a battery capacity and a battery temperature are acquired. A threshold is defined for each of the battery capacity and the battery temperature. In this example, a required current value for deterioration determination as a reference to be output to the secondary battery 20 is defined beforehand in the secondary battery 20.

As shown in FIG. 9, the output current determiner 102 determines whether the battery capacity obtained by the first acquirer 101 is greater than or equal to the threshold or not (S11). If the battery capacity obtained by the first acquirer 101 is not greater than or equal to the threshold (No), a required current is increased for electrification (S12). If the battery capacity obtained by the first acquirer 101 is greater than or equal to the threshold (Yes), it is determined whether the battery temperature obtained by the first acquirer 101 is greater than or equal to a threshold or not (S13). If the battery temperature obtained by the first acquirer 101 is not greater than or equal to the threshold (No), the required current is reduced for electrification (S14). If the battery temperature obtained by the first acquirer 101 is greater than or equal to the threshold (Yes), the required current is used for electrification without change (S15). As described above, the output current determiner 102 may be configured such that an output current value A1 appropriate for deterioration determination may be defined in accordance with, for example, the battery capacity and the battery temperature.

FIG. 9 merely shows an example of a process flow with which an output current value A1 is determined in the output current determiner 102. Herein, the degree of increase in the required current or the degree of decrease in the required current may be appropriately defined in consideration of the relationship with the battery capacity or the battery temperature. As the thresholds defined for the battery capacity and the battery temperature, thresholds appropriate for the secondary battery 20 may be defined. The output current determiner 102 is not limited to the example described above.

For example, the information is not limited to the battery capacity and the battery temperature, and based on the information obtained by the first acquirer 101, conditions may be further subdivided to set a process flow for obtaining an appropriate output current value A1. The example is not limited to the process flow, in the output current determiner 102, a predetermined calculation formula for deriving an output current value A1 appropriate for deterioration determination in accordance with the state of the secondary battery 20 may be previously defined based on the information obtained by the first acquirer 101, for example. As described above, the output current determiner 102 may be configured to determine an output current value A1 appropriate for deterioration determination based on the predetermined calculation formula and the information obtained by the first acquirer 101.

The output current determiner 102 has been described above. As shown in FIG. 3, the SOC-OCV curve SV1 of the deteriorated secondary battery 20 shows a small change of the open-circuit voltage with respect to an SOC change. In addition, as shown in FIG. 7, in the graph showing an example of a change in the charge/discharge characteristic, the charge/discharge characteristic K1 of the deteriorated secondary battery 20 tends to show a large change in voltage value (open-circuit voltage) with respect to the charge quantity. In the evaluation device disclosed herein, the output current A1 to be output from the secondary battery 20 is determined based on the information obtained by the first acquirer 101. That is, a required current required in deterioration determination is adjusted based on information such as a full charge capacity and a battery temperature of the secondary battery 20. Thus, an appropriate required current is set in accordance with the state of the secondary battery 20, such as the full charge capacity and the battery temperature of the secondary battery 20. Thus, appropriate discharge data appropriate for deterioration determination is obtained in accordance with the state of the secondary battery 20, such as the full charge capacity and the battery temperature of the secondary battery 20.

The evaluator 103 is configured to evaluate the secondary battery 20 based on discharge data obtained at output of the secondary battery 20, based on the output current value A1 determined by the output current determiner 102.

In the evaluation device disclosed herein, the output current A1 to be output from the secondary battery 20 is determined based on the information obtained by the first acquirer 101. In the output current determiner 102, the output current value A1 appropriate for deterioration determination is determined in accordance with the state of deterioration of the secondary battery 20. Specifically, based on the information obtained by the first acquirer 101, such as a battery capacity, a battery temperature, a battery resistance, and a voltage value, the output current value A1 appropriate for deterioration determination is determined in accordance with the state of the secondary battery 20. Then, % when the determined output current value A1 is output, discharge data is obtained. The evaluator 103 evaluates the secondary battery 20 based on the discharge data appropriate for the deterioration determination.

In the evaluator 103, based on the discharge data, for example, $(V_1-V_2)/A_1$ obtained by dividing a voltage drop amount $(V_1-V_2)$ by a current value A1 in obtaining a discharge curve is obtained. The evaluator 103 may be configured to determine that the secondary battery 20 has "deteriorated" if the $(V_1-V_2)/A_1$ is larger than the predetermined resistance value. Based on the output current value A1 determined by the output current determiner 102, the secondary battery 20 discharges and the evaluator 103 obtains the discharge data. Consequently, based on the discharge data, deterioration due to an increased resistance or the degree of deterioration is measured.

As shown in FIG. 3, in the secondary battery 20 whose full charge capacity has decreased, the open-circuit voltage OCV is low with respect to the SOC and the SOC-OCV curve SV1 is gentle. Thus, even at the same open-circuit voltage Vm, the SOC (m1) of the secondary battery 20 is higher than the SOC (m0) of the non-defective secondary battery. Accordingly, when the SOC of the secondary battery 20 is determined based on the open-circuit voltage Vm relative to the SOC-OCV curve SV0 of the non-defective secondary battery 20, the SOC of the secondary battery whose capacity has deteriorated is evaluated to be lower than an actual SOC.

In such a case, when the non-defective secondary battery and the secondary battery whose capacity has deteriorated are adjusted to the same open-circuit voltage, and then are discharged with the same current value, the difference in voltage drop amount between the non-defective secondary battery and the secondary battery whose capacity has deteriorated is small, and thus, resistance deterioration might be erroneously determined. On the other hand, in the device for evaluating a secondary battery disclosed herein, the battery capacity (full charge capacity) and the battery temperature, for example, of the secondary battery 20 are taken into consideration, and an appropriate output current value A1 for determining resistance deterioration is determined in accordance with the state of the secondary battery 20. Thus, in the secondary battery 20 whose full charge capacity has decreased, as shown in FIG. 3, an output current value A1 in accordance with the gentle SOC-OCV curve SV1 in which the open-circuit voltage OCV is low relative to the SOC. Accordingly, appropriate discharge data in accordance with resistance deterioration is obtained.

For example, in deterioration determination of a secondary battery mounted on an electric motor vehicle as a power supply for driving the vehicle, the "predetermined resistance value" can be defined as a resistance value satisfying a required output from the vehicle. In this case, (V1−V2)/A may be obtained from an obtained discharge curve and it is determined whether (V1−V2)/A1>"resistance value satisfying required output from vehicle" is satisfied or not. Herein, based on information obtained by the first acquirer 101, such as a battery capacity, a battery temperature, a battery resistance, and a voltage value, the output current value A1 appropriate for deterioration determination may be determined in accordance with the state of the secondary battery 20. Then, appropriate discharge data in accordance with resistance deterioration may be obtained. Thus, an appropriate value as (V1−V2)/A1 may be obtained, and it may be appropriately determined whether (V1−V2)/A1>"resistance value satisfying required output from vehicle" is satisfied or not.

For example, another case where the secondary batteries are adjusted to the same open-circuit voltage, and then are discharged with the same current value to obtain (V1−V2)/A1 so that resistance deterioration is erroneously determined can be a case where the capacity of the secondary battery has deteriorated. When a secondary battery whose capacity has deteriorated is discharged in the same period with the same current value as a non-defective secondary battery, the secondary battery whose capacity has deteriorated tends to show a large change in SOC. In particular, in a case where the output current value A1 is large, when the secondary battery whose capacity has deteriorated is discharged to a low-SOC state lower than an SOC of 10%, no appropriate value can be obtained as (V1−V2)/A1. Thus, it is not appropriately determined whether (V1−V2)/A1>"resistance value satisfying required output from vehicle" is satisfied or not, in some cases. On the other hand, in the method for evaluating a secondary battery disclosed herein, the output current value A1 is determined based on, for example, the battery capacity, the battery temperature, the battery resistance, and/or the voltage value. Then, when the determined output current value A1 is output, discharge data is obtained. Based on the discharge data, the deterioration state of the secondary battery is evaluated. Thus, even in a case where the capacity of the secondary battery has deteriorated, an appropriate output current value A1 is determined based on, for example, the battery capacity, the battery temperature, the battery resistance, and/or the voltage value. Thus, an appropriate value as (V1−V2)/A can be obtained. Then, it is appropriately determined whether (V1−V2)/A1>"resistance value satisfying required output from vehicle" or not.

Various embodiments of the method for evaluating a secondary battery, the device for evaluating a secondary battery, and the power supply system have been described hereinabove according to the present disclosure. Unless specifically stated otherwise, the embodiments of the method for evaluating a secondary battery, the device for evaluating a secondary battery, and the power supply system presented herein do not limit the scope of the present invention. It should be noted that various other modifications and alterations may be possible in the embodiments of the method for evaluating a secondary battery, the device for evaluating a secondary battery, and the power supply system disclosed herein. In addition, the features, structures, or steps described herein may be omitted as appropriate, or may be combined in any suitable combinations, unless specifically stated otherwise.

What is claimed is:

1. A method for evaluating a secondary battery, the method comprising:
    obtaining, as a first step, information on a predetermined item from a secondary battery to be evaluated;
    determining, as a second step, an output current value A1 appropriate for deterioration determination to be output from the secondary battery to be evaluated, based on the information obtained in the first step; and
    evaluating, as a third step, a deterioration state of the secondary battery to be evaluated, based on discharge data obtained when the output current value A1 determined in the second step is output.

2. The method for evaluating a secondary battery according to claim 1, wherein the information obtained in the first step is at least one measured value selected from the group consisting of a battery capacity, a battery temperature, a battery resistance, and a voltage value.

3. The method for evaluating a secondary battery according to claim 1, wherein in the second step, the output current value A1 to be output from the secondary battery is determined based on a control map in which a relationship between the information obtained in the first step and the output current value A1 is stored beforehand.

4. The method for evaluating a secondary battery according to claim 1,
    wherein the discharge data includes a voltage V1 at discharge start and a voltage V2 after a lapse of a predetermined time from the discharge start;
    wherein in the third step, it is determined whether (V1−V2)/A1 is higher than a predetermined threshold RO or not, based on the voltage V1, the voltage V2, and the output current value A1.

5. A device for evaluating a secondary battery, the device comprising:
    a first acquirer that acquires information on a predetermined item from a secondary battery to be evaluated;
    an output current determiner that determines an output current value A1 appropriate for deterioration determination to be output from the secondary battery, based on the information obtained by the first acquirer; and
    an evaluator that evaluates a deterioration state of the secondary battery, based on discharge data obtained when the output current value A1 determined by the output current determiner is output.

6. The device for evaluating a secondary battery according to claim 5, wherein the information obtained by the first acquirer is at least one measured value selected from the group consisting of a battery capacity, a battery temperature, a battery resistance, and a voltage value.

7. The device for evaluating a secondary battery according to claim 5, the device further comprising:
    a memory in which a relationship between the information obtained by the first acquirer and the output current value A1 to be output from the secondary battery is stored beforehand, wherein
    the output current determiner is configured to determine the output current value A1 based on the relationship between the information obtained by the first acquirer and the relationship stored in the memory.

8. The device for evaluating a secondary battery according to claim 5,
   wherein the discharge data includes a voltage at discharge start and a voltage after a lapse of a predetermined time from the discharge start;
   wherein the evaluator is configured to determine whether $(V1-V2)/A1$ is higher than a predetermined threshold RO or not, based on the voltage $V1$, the voltage $V2$, and the output current value $A1$.

9. A power supply system, comprising:
   a secondary battery; and
   a controller that controls an output of electric power to the secondary battery, wherein
   the controller includes
      a first acquirer that acquires information on a predetermined item from the secondary battery,
      an output current determiner that determines an output current value $A1$ appropriate for deterioration determination to be output from the secondary battery, based on the information obtained by the first acquirer, and
      an evaluator that evaluates the secondary battery, based on discharge data obtained when the output current value $A1$ determined by the output current determiner is output.

10. The power supply system according to claim 9, wherein the information obtained by the first acquirer is at least one measured value selected from the group consisting of a battery capacity, a battery temperature, a battery resistance, and a voltage value.

11. The power supply system according to claim 9, further comprising:
    a memory in which a relationship between the information obtained by the first acquirer and the output current value $A1$ to be output from the secondary battery is stored beforehand, wherein
    the output current determiner is configured to determine the output current value $A1$ based on the relationship between the information obtained by the first acquirer and the relationship stored in the memory.

12. The power supply system according to claim 9,
    wherein the discharge data includes a voltage $V1$ at discharge start and a voltage $V2$ at discharge end;
    wherein the evaluator is configured to determine whether $(V1-V2)/A1$ is higher than a predetermined threshold RO or not, based on the voltage $V1$, the voltage $V2$, and the output current value $A1$.

* * * * *